United States Patent [19]

Vallas

[11] 4,068,228
[45] Jan. 10, 1978

[54] MULTIPLE CHANNEL AMPLIFIER

[75] Inventor: Gilbert Vallas, Croissy Sur Seine, France

[73] Assignee: Electronique Marcel Dassault, Paris, France

[21] Appl. No.: 675,450

[22] Filed: Apr. 9, 1976

Related U.S. Application Data

[63] Continuation-in-part of Ser. No. 539,244, Jan. 7, 1975, abandoned.

[30] Foreign Application Priority Data

Jan. 8, 1974 France ................................. 74 00584

[51] Int. Cl.² .................. H03K 13/02; H03F 3/68; G03T 1/00
[52] U.S. Cl. .......................... 340/347 AD; 330/295; 330/124 R; 364/582; 364/606
[58] Field of Search ................ 340/347 AD, 347 DA, 340/347 DD, 15.5 GC, 146.2; 330/30 R, 124 R; 235/150.52

[56] References Cited

U.S. PATENT DOCUMENTS

| | | | |
|---|---|---|---|
| 3,350,571 | 10/1967 | Moulton et al. | 330/124 R |
| 3,422,423 | 1/1969 | Kaszynski et al. | 340/347 DA |
| 3,525,948 | 8/1970 | Sherer et al. | 340/15.5 GC |
| 3,798,637 | 3/1974 | Frauhauf | 340/347 AD |
| 3,813,609 | 5/1974 | Wilkes et al. | 340/15.5 GC |
| 3,838,413 | 9/1974 | Wehrman | 340/347 AD |
| 3,997,764 | 12/1976 | Belmonte et al. | 340/347 AD |
| 3,999,181 | 12/1976 | Hirsch | 340/347 DA |

OTHER PUBLICATIONS

Gaines: Stochastic Computer Thrives on Noise Electronics, July 10, 1967, pp. 72-79.
Department of Computer Science, Univ. of Illinois: Multiplier and Divider, Quarterly Tech. Program Report 10-11-12, 1965, pp. 12-14.
Poppelbaum: Divider, Electronics, December 12, 1966, p. 48.

*Primary Examiner*—Felix D. Gruber
*Attorney, Agent, or Firm*—Burgess, Ryan and Wayne

[57] ABSTRACT

An amplifier for an electromagnetic radiation receiver has a plurality of amplification channels for the determination of angular separations, especially for use in self guiding equipment in missiles in which each amplification channel has several amplification stages each of which is of fixed gain. Means are provided to vary the number of operational stages as a function of the sum of the outputs of the channels. A converter is disclosed for converting the analog signal values to stochastic values. A division process is disclosed for the data, based on the use of simple operator and stochastic values.

9 Claims, 3 Drawing Figures

MULTIPLE CHANNEL AMPLIFIER

This application is a continuation-in-part of U.S. patent application Ser. No. 539,244 filed Jan. 7, 1975 and now abandoned.

The invention relates to amplifiers for electromagnetic radiation receivers having several amplification channels for determination of angular separations, especially designed to be part of guidance equipment employed to guide a projectile or missile to a target from which the received energy originates.

The accuracy of the results obtained by such receivers depends on how uniform the gains of the different amplification channels are. This equality is difficult, and sometimes impossible, to maintain in response to signal amplitudes which vary greatly.

The present invention is based on the observation that it is relatively easy to construct amplifiers having the same gain when the amplifiers are of fixed gain. It is therefore characterized in that each of the amplification channels of the receiver comprises a multiplicity of amplification stages each of which is of fixed gain and in that means are provided to selectively put into operational condition, in each channel, a number of amplification stages corresponding to the total desired gain for the channels.

Receivers having several amplification channels designed to supply angular separation values also frequently involve a numerical division operation. Because of the difficulty of carrying out this operation in the receivers known hitherto, it has been proposed to avoid the problem by extracting the value of the angular separations from the gain which the amplification channels would show in order that the constancy of the output of one of these channels is assured. Equipment of this type, however, is of relatively complicated construction and is very expensive.

In this respect, the invention provides means for carrying out the division by a very simple operation owing to the fact that the division is based on stochastic values. The invention is therefore characterized in that the equipment comprises coding means to transform the analog values of the signals into stochastic values at the output of the amplification channels, in such a way that division of a signal difference by a signal sum to obtain the angular separation values can be achieved by simple means.

The description which follows, given as an example, refers to the attached drawing, in which.

Figure 1:
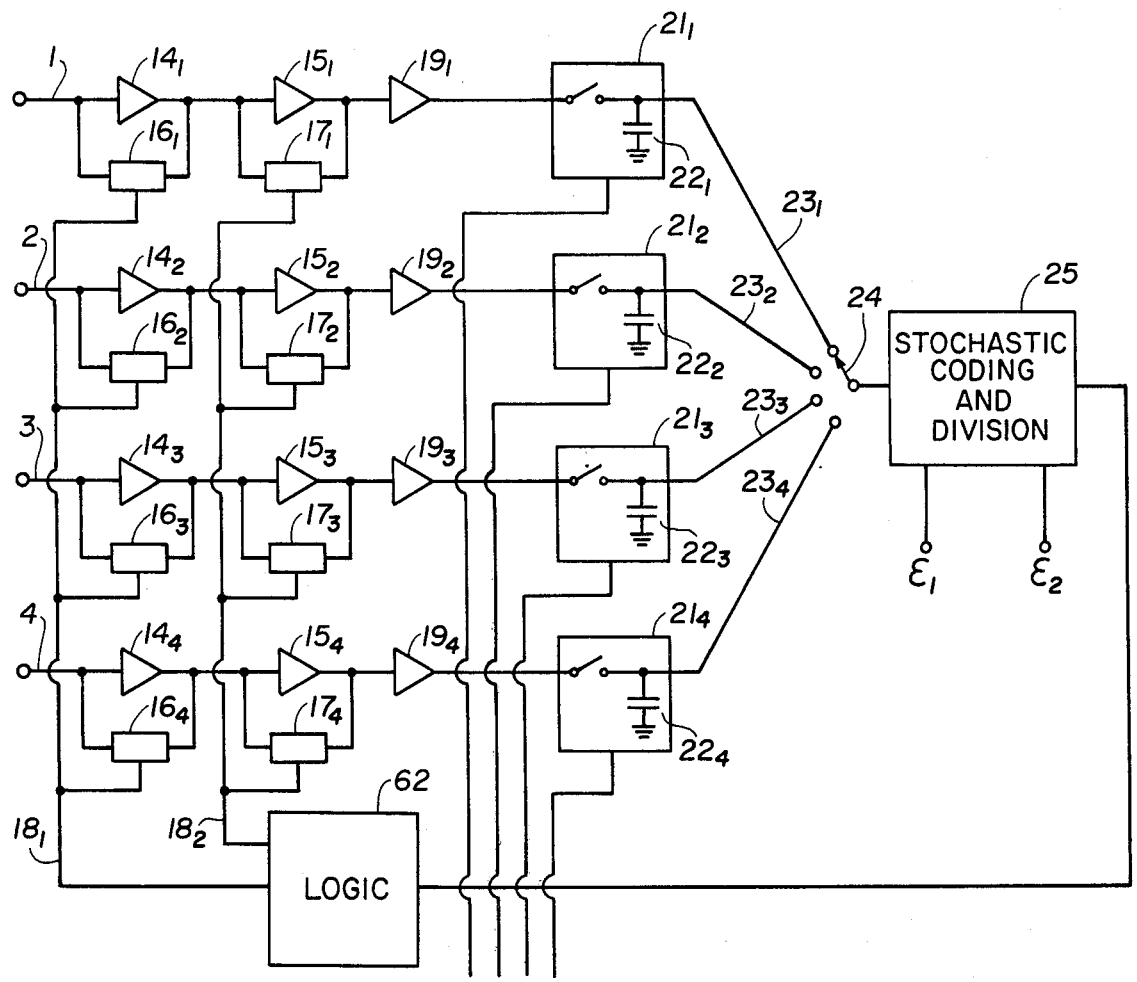
FIG. 1 is a block diagram of a system in accordance with the invention.
Figure 2:
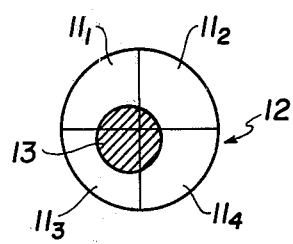
FIG. 2 is a representation of an image on a photoelectric cell.

Referring now to FIG. 1, the receiver equipment in accordance with the invention is comprised of four amplification channels 1, 2, 3 and 4. These channels are adapted to receive signals, for example, from four juxtaposed sectors $11_1$, $11_2$, $11_3$ and $11_4$ respectively of a photocell 12. The sectors of the photocell, and the photocell 12 are represented in FIG. 2, wherein the image 13 of a target is shown misaligned with respect to the sectors.

In order to provide a determination of the alignment of the image of the target on the photocell, components $\epsilon_1$ and $\epsilon_2$ of angular separation can be defined which satisfy the equations:

$$\epsilon_1 = \frac{E_1 + E_2 - E_3 - E_4}{E_1 + E_2 + E_3 + E_4}$$

$$\epsilon_2 = \frac{E_1 - E_2 + E_3 - E_4}{E_1 + E_2 + E_3 + E_4}$$

in which $E_1$, $E_2$, $E_3$, $E_4$ are quantities corresponding to the outputs of the sectors $11_1$, $11_2$, $11_3$, $11_4$ respectively. It can be shown that if $\epsilon_1 = \epsilon_2 = 0$, the angular separation of the image of the target on the photocell is 0, so that the axis of the photocell 12 is symmetrically aligned on the image of the target.

Each of the amplification channels comprises a certain number of cascade connected amplification stages, such as the two amplifier stages $14_1$, $15_1$; $14_2$, $15_2$; $14_3$, $15_3$; $14_4$, $15_4$ respectively, shown in FIG. 1. Each of the stages 14, 15 has a fixed gain, so that conformity of the gains of the stages of the same sequence is easily achieved. Thus, each of the amplifiers $14_1$, $14_2$, $14_3$ and $14_4$ have the same gain, and each of the amplifiers $15_1$, $15_2$, $15_3$ and $15_4$ have the same gain. The amplifiers of one stage can have a different amplification than the amplifiers of the other stage, however, so that each of the amplifiers 14 may have a gain different from the gain of the respective amplifier 15.

Each of the amplification stages of the channels can be switched into or switched out of the circuit by switches $16_1$, $17_1$; $16_2$, $17_2$; $16_3$, $17_3$; $16_4$, $17_4$ respectively. When the switches are open, their respective amplifier stages are operational, whereas when the switches are closed, the respective amplifier stages are bypassed. The switches $16_1 \ldots 16_4$ and $17_1 \ldots 17_4$ may comprise transistor switches.

The switches 16 of the first stage of channels are simultaneously operable, i.e., they are simultaneously open or shut. Similarly, the switches 17 of the second stage of channels are simultaneously operable, i.e., these switches are also simultaneously operable. For this purpose, the gates of all of the switches 14 are connected to a common line $18_1$, and the gates of all of the switches 17 are connected to a common line $18_2$. The resistance of the switches may thus be substantially 0, or a large value, depending upon the biasing voltage applied to the respective lines $18_1$ and $18_2$. The outputs of the amplifiers $15_1 \ldots 15_4$ are connected to extrapolation devices or locking samplers $21_1 \ldots 21_4$ respectively by way of additional amplifiers $19_1 \ldots 19_4$ respectively. The locking samplers are illustrated in schematic as including capacitors $22_1$–$22_4$ respectively for storing the signals from the respective channels, the capacitors being illustrated as being connected to the respective amplifiers by way of switches in the locking samplers.

Signals received by the amplification channels from the sectors of the photocell are very short duration, for example, of 20 to 50 nanoseconds duration. A computer requires a signal of much longer duration for operation. Consequently, the condensers 22 are charged during this very short duration by way of the amplifiers 19, the capacitors then being disconnected from the amplifiers by means of the respective switches, so that the peak value of the voltage in the respective channel is maintained. The amplifiers 19 are preferably power amplifiers. As a consequence, the capacitors $22_1$–$22_4$ are capable of supplying signals of sufficient duration to the channel outputs $23_1$–$23_4$ respectively. These channel outputs are selectively connected to a computer comprised of a stochastic coding and stochastic division device 25, by way of a selector switch 24.

Figure 3:
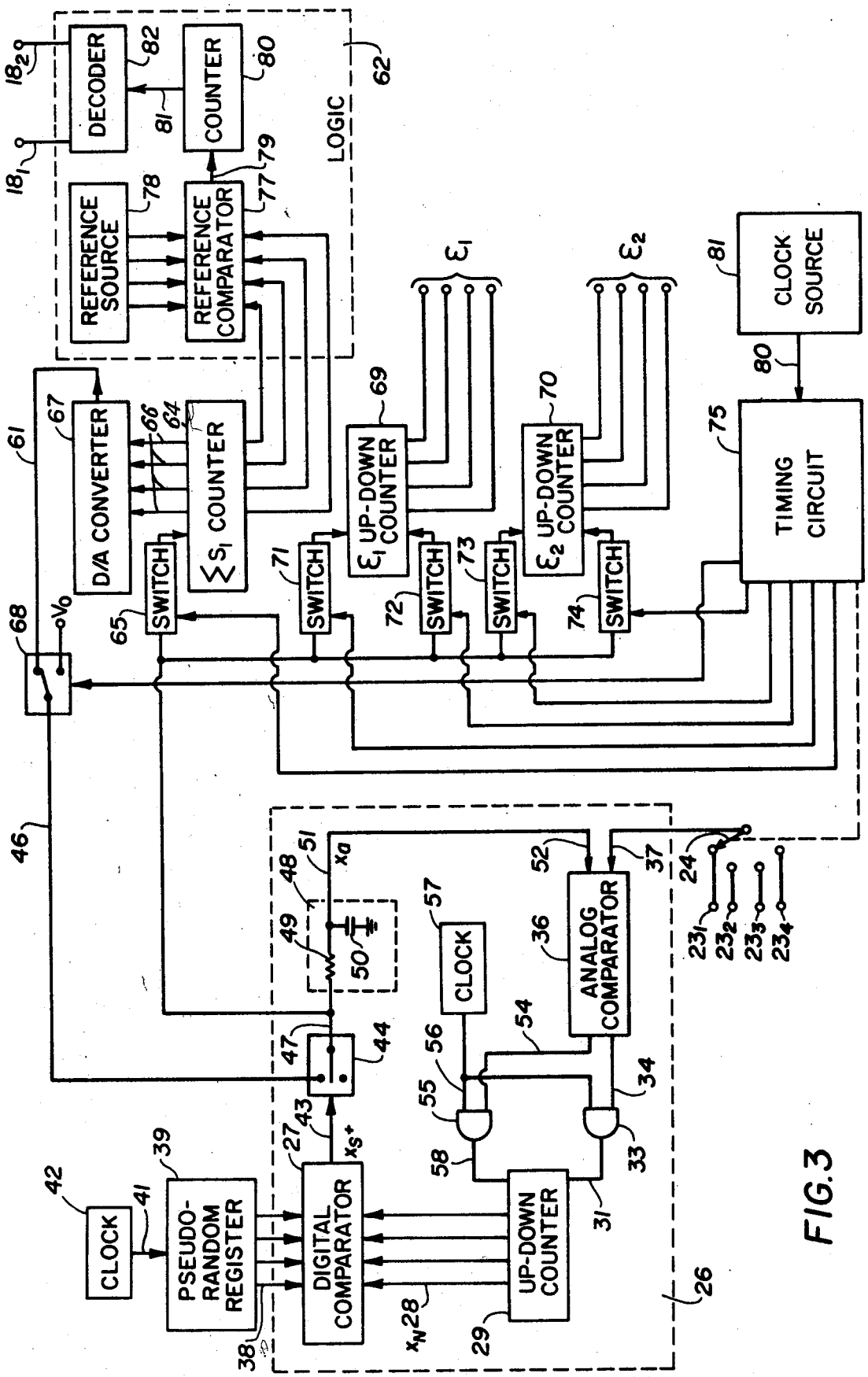
FIG. 3 is a block diagram of a coder for use in the system of FIG. 1.

Referring to FIG. 3, the device 25 comprises a closed circuit 26, enclosed in the dashed lines, including a digital comparator 27 having a row of inputs 28 connected to up-down counter 29. One input 31 of counter 29 is connected to the output of an AND-gate 33, one input of which 34 is connected to an output of an analog comparator 36. The voltage to be coded, which is the voltage from one of the channel outputs 23, is applied to an input 37 of comparator 36 by way of switch 24.

Another row of inputs 38 of the digital comparator 27 is connected to the output of a pseudo-random register 39 which changes state on each impulse provided thereto at its input 41 by a clock 42. All the states of the register 39 appear successively at the outputs 38 with uniform distribution in accordance with a pseudo-random process.

As a consequence, the numerical comparator 27 delivers a series of "1" or "0" data according to whether the $x_n$ data supplied in natural binary from the counter 29 is greater or not than the state of the pseudo-random register at the same instant.

The sequence of $x_s+$, "1" or "0" data present at the output 43 of the digital comparator 27 is the $x_N$ stochastic image.

The output 43 of the digital comparator 27 is connected to the gate of a switch 44. This switch may comprise a transistor switch. The switch 44 is connected to apply a voltage $V_0$ from line 46 to the input 47 of a filter 48. The filter 48 is comprised of a series resistor 49 and a parallel capacitor 50. The voltage $V_0$ is applied to the line 46 by way of a further switch 68. As a consequence, it is apparent that the voltage $V_0$ is applied to the filter 48 in the rhythm of the $x_s+$ stochastic data. The $x_a$ value of the voltage present at the output 51 of the filter 50 is applied to the second input 52 of the analog comparator 36. A second output of said comparator is applied to the first input 54 of an AND-gate 55. The other input 56 of AND gate 55 receives clock impulses from a clock 57. The clock 57 preferably steps in synchronism with the clock 42. The output 58 of AND gate 55 is applied to the second input of the up-down counter 29.

In the closed circuit 26, which comprises the counter 29, the digital comparator 27, the switch 44, the filter 48 and the comparator 36, the pulses from the clock 57 are applied to the up-counting input or the down-counting input of up-down counter 29 until equilibrium is achieved. At that time the stochastic datum corresponding to the analog value $x$ of the voltage to be coded is present at the output 43 of the digital comparator 27.

An oscillation threshold may be employed in the comparator 36 for circuit stability.

The same device can alternatively be used to carry out division by stochastic processes of one voltage value by another. The dividend voltage $x$ is applied to input 37 of the comparator 36 and the divisor voltage $y$ is applied to input line 46 of the device.

In such an alternate embodiment or utilization of the circuit 26, the condition of equilibrium in the closed circuit 26 is expressed by:

$$qy = x$$

The $q_n$ datum present at output of the up-down counter 29 represents the quotient in natural binary form and the $q_{st}$ datum present at output 43 of the digital comparator 27 represents the quotient in stochastic form, which can be converted into an analog or numerical value.

The device 25 (FIG. 3) also comprises means to supply the sum $\Sigma S_i$, i.e. $(S_1 + S_2 + S_3 + S_4)$ at its output 61, where $S_1$, $S_2$, $S_3$ and $S_4$ are the individual voltages at outputs 23.1, 23.2, 23.3 and 23.4 of channels 1, 2, 3, 4 respectively. This means comprises a counter 64. The input of counter 64 is connected to line 47 through a switch 65, and the outputs 66 of the counter 64 are connected to the inputs of a digital-analog converter 67. The output 61 of the converter 67 is connected to one pole of the switch 68, the other pole of which is connected to the reference voltage $V_0$. As disclosed above, the arm of switch 68 is connected to the ungrounded pole of switch 44. The sum signal $\Sigma S_i$, as stochastic datum, is thus applied to the divisor entry 47 of the closed circuit 26, so that this circuit sequentially produces $$\frac{S_1}{\Sigma S_i}, \frac{S_2}{\Sigma S_i}, \frac{S_3}{\Sigma S_i} \text{ and } \frac{S_4}{\Sigma S_i}.$$

The signals $\epsilon_1$ and $\epsilon_2$ are formed by two up-down counters 69 and 70, the inputs of which are connected to line 47, i.e., $x_s+$, by way of switches 71 and 72 for counter 69, and switches 73 and 74 for counter 70. When 71 and 73 are closed, the counters count up, when 72 and 74 are closed, they count down.

The switches 65, 68 and 71-74 may comprise transistor switches, and the operation of these switches is controlled by the respective gate terminals, which are connected to a timing circuit 75. The switch 24 is also controlled in sequence with the operation of the timing circuit, as indicated by the dashed line connecting this switch to the timing circuit. It is of course apparent that the switch 24 may be formed of solid state devices, and the showing of the switch as a mechanical switch simplifies the explanation of the invention. The input 80 of the timing circuit 75 is connected to a source 81 of clock signals.

During a first period of operation of the system of FIG. 3, the timing circuit connects the switch 24 to the channel output $23_1$. At this time the switch 28 applies the voltage $V_0$ to the filter 48, and the switches 65 and 71-74 are open.

Signal $S_1$ thus appears on switch 24 and is applied to the closed circuit 26 through line 37. The stochastic value $x_s+$ is thus formed by recurrence. Then the switch 65 is closed by the timing circuit, so that the signal $S_1$ is written in the counter 64. The same cycle occurs for the signals $S_2$, $S_3$ and $S_4$ in sequence, so that, at the end of the first period, the signal $\Sigma S_1$ is stored in the counter 64, which has successively counted the signals $S_1$, $S_2$, $S_3$ and $S_4$.

In a second period of operation of the system, the timing circuit 75 opens the switch 65, so that a new signal $S_1$ is formed as it was during the first period of operation. The switch 68 is then switched, to apply the output of the converter 67 on line 61 to the closed circuit, so that $S_i$ is applied as a divisor to the closed circuit 26, which then forms $(S_1/\Sigma S_i)$. The switches 71 and 73 are then closed, so that the formed signal is up-counted in the counters 69 and 70.

The same switching sequence then occurs for $S_2$, but in this case switches 71 and 74 are closed, so that $(S_2/\Sigma S_i)$ is up-counted in counter 69 and down-counted in counter 70. The same sequence subsequently occurs for $S_3$ and $S_4$, but the switches in these cases are connected so that $(S_3/\Sigma S_i)$ is downcounted in counter 69 and up-counted in counter 70, and $(S_4/\Sigma S_i)$ is downcounted in both counters.

As a result, at the end of the second period, $\epsilon_1$ is stored in counter 69 and $\epsilon_2$ is stored in counter 70. These signals may thus be provided in parallel binary form, as indicated in FIG. 3, although it will be apparent that they may be converted to other forms as desired, by conventional means.

Since $\Sigma S_i$ is counted as a stochastic value in counter 64, it is necessary to convert it to analog form in the digital analog converter 67, so that it can be applied as an analog value on line 47.

At the end of the above described cycle, the separation measurements, i.e., the values of $\epsilon_1$ and $\epsilon_2$, are available in binary form in the two up and down counters 69 and 70.

Referring again to FIG. 1, an output of the stochastic coding and division circuit 25 is connected to a logic circuit 62, the output of the logic circuit 62 being connected to the gate leads $18_1$ and $18_2$. The logic circuit 62 serves to control the amplification simultaneously in the channels 1-4.

The details of the logic circuit 62 are illustrated in FIG. 3, wherein it is seen that the outputs of the $\Sigma S_i$ counter 64 are also connected to a reference comparator 77 in the logic circuit. A source 78 of binary reference signals is also connected to the comparator 77, and the pulsed output 79 of the comparator 77 is applied to a counter 80. The output 81 of the counter 80 is applied to a decoder 82. The output of the decoder 82, which forms the output of the logic circuit 62, is connected to the lines $18_1$ and $18_2$. The source 78 of reference binary signals may be a manually settable source of conventional nature.

If the value of $\Sigma S_i$ is higher than the reference voltage, voltages are applied to $18_1$ and $18_2$, so that both switches 16 and 17 are closed. The gains of the amplifiers 14 and 15, then are "1". If $\Sigma S_i$ is lower than the reference voltage, voltage is applied only to switches 16, so that only these switches are closed. Consequently, only the amplifier stages 15 are active in the circuit. If $\Sigma S_i$ remains lower than the reference voltage no voltage is applied to switches 16, so that both amplifiers are operated. The gain of one channel may have three different values, but the gains of the four channels 1 to 4 are always exactly the same.

The timing circuit 75 may of course be of conventional nature, and from the above description it is apparent that the timing circuit continuously operates the switch 24 to sequentially apply the signals $23_1$–$23_4$ to the analog comparator 37. During the first period of the cycle, i.e., during the first sequence of operation of the switch 24 by the timing circuit 75, the switch 65 is closed momentarily following the resting of the switch 24 on each contact for a determined time, i.e., the time to form the stochastic values of the signals by recurrence. In the second period, i.e., the second sequence of operation of the switch 24, the switch 65 is not actuated by the timing circuit, but instead the switch 68 is actuated at each of the positions of the switch 24, simultaneously with the combinations of the switches 71-74 as discussed above.

The timing circuit may thereby be comprised of conventional timing circuits to provide the output signals for controlling the switches in this sequence.

The switches of the locking samplers $21_1$–$21_4$ of FIG. 1 may also be controlled by the timing circuit 75, these switches being sequentially switched in synchronism with the switching of positions of the switch 24, with the closing period of each switch of a locking sampler 21 occurring prior to the closure of the corresponding contact of the switch 24 in order to ensure the storage of a full charge on the corresponding capacitor before application to the analog comparator 36.

While the invention has been disclosed with reference to a single embodiment, it will be apparent that variations and modifications may be made therein, and it is intended in the following claims to cover each such variation and modification as falls within the true spirit and scope of the invention.

What is claimed is:

1. A multi-channel amplifier having a plurality of amplification channels each of which comprises a plurality of cascade connected amplification stages, each of said stages having a fixed gain, and each of said amplification stages in a given channel corresponding to an amplification stage in each of the other said channels and having the same gain as the corresponding amplification stages in the other channels, means for selectively and simultaneously shunting corresponding amplification stages in said channels, means for generating coded pulse signals to represent the amplitude of the signal output of each channel, counter means for adding said pulse signals to provide a count signal representative of the sum of the amplitudes of the output signals of the channels, and means for varying the number of amplification stages shunted as a function of said sum, the amplification stages, the means for summing the output voltages of the stages and the means for varying the number of amplification stages forming a closed feedback circuit, so that the gain of any channel remains identical to the gain of the other channels and the amplitude of said sum remains approximately constant independent of variations in the amplitude of the signals at the input terminals of the channels.

2. The multi-channel amplifier of claim 1 wherein each of said channels has first and second amplification stages, said first amplification stages each having a first fixed gain and said second amplification stages each having a second fixed gain, said means for selectively shunting the input and output terminals of a predetermined number of stages of each channel comprising first means for simultaneously shunting all of said first stages and second means for simultaneously shunting all of said second stages.

3. A multi-channel amplifier in accordance with claim 1, further comprising means for dividing a value determined by pulse signals representative of the output of each channel by an analog value corresponding to said sum, to provide resultant pulse signals corresponding to the dividend of said values, and means for adding the values corresponding to said resultant pulse signals.

4. An amplifier system for a receiver of a separation measurement radiation installation comprising a plurality of channels for the processing of separate input signals, a coder for transforming analog signals present at the outputs of the channels into signals having stochastic values, means for adding the signals having said stochastic values to provide a sum signal having a corresponding stochastic value, means for converting the stochastic value of the sum signal into an analog signal, means for dividing said stochastic values of said signals by the value of said analog signal to provide corresponding ratio signals, and means for adding or subtracting the values of said ratio signals.

5. A combined multi-channel amplifier and computer system, said computer comprising means for comparing an output signal of each of said channels with a computed analog value, an up-down counter, means for changing the state of said up-down counter as a result of said comparison, means for comparing said counter state with a pseudo-random value to provide a comparison signal having a stochastic value, means for converting said comparison signal having said stochastic value into an analog signal having a computed value, and means for feeding back said analog signal to said means for comparing in order to change said state of said counter until said computed value of said analog signal is equal to the value of the output signal of said channel, said comparison signal then having a stochastic value which is a coded equivalent of the value of said output signal.

6. A combined multi-channel amplifier and computer system wherein the output signals of said channels are applied to said computer, said computer comprising means for coding analog values into stochastic values, said means for coding comprising an analog comparator having first and second input terminals and an output terminal, said first input terminal being coupled to one of said output signals of said channels which has an analog value to be coded, an up-down counter having input and output terminals, a first clock pulse generator having a first clock output signal, means for providing the said first clock signal to said input terminals of said up-down counter in response to the signal at the output terminal of said analog comparator, a second clock pulse generator operating in synchronism with said first clock, a pseudo-random register having input and output terminals, the input terminal of said pseudo-random register being connected to said second clock pulse generator, a digital comparator having a first and a second row of inputs and an output, said first row of inputs being connected to said output terminals of said pseudo-random register and said second row of inputs being connected to said output terminals of said up-down counter, the output of said digital comparator having said stochastic value, said computer also comprising stochastic-analog conversion means having input and output terminals, said input of said conversion means being connected to the output of said digital comparator, and said output of said conversion means being connected to said second input terminal of said analog comparator.

7. A system in accordance with claim 6, wherein the stochastic-analog conversion means comprises a filter, and a switch controlled by the stochastic value present at the output of the digital comparator, for selectively applying one of two reference voltages to the input of the filter, the output of said filter being connected to the second input of the analog comparator.

8. A system in accordance with claim 6, wherein the analog comparator comprises two AND-gates having each one output and two inputs, said outputs being connected to up-counting and down-counting inputs of the up-down counter, means connecting first inputs of the two AND-gates to said output of said analog comparator, the second inputs of said two AND-gates being coupled to receive the pulses of said first clock.

9. A diviser means for dividing a signal having a first analog value by a signal having a second analog value, comprising means for comparing said first analog value with a computed analog value, means for changing the state of an up-down counter as a result of said comparison, means for comparing said counter state with a signal having a pseudo-random value thereby forming a signal having a stochastic digital value, switching means controlled by said signal having said stochastic value for selectively applying said second analog value to a filter means, the output signal of said filter being said computed analog value, means for feeding back said computed analog value to said comparing means in order to modify said counter state until said computed analog value is equal to said first analog value, the output of said comparing means being representative of the dividend of said first and second analog values.

* * * * *